United States Patent [19]

Joly et al.

[11] Patent Number: 4,692,842

[45] Date of Patent: Sep. 8, 1987

[54] INPUT/OUTPUT DEVICE FOR AN APPARATUS OF THE PROGRAMMABLE AUTO-CONTROL TYPE, A RANGE OF SUCH DEVICES

[75] Inventors: Jean Joly, Houilles; Yves Oehlert, Rueil; Jean Neyroud, Domaines; Olivier Penot, Antibes; Jacky Pergent, Carros; Gilbert Barillier, Gattieres; Bernard LeBlanc, Biot all of France

[73] Assignee: La Telemecanique Electrique, Nanterre, France

[21] Appl. No.: 691,487

[22] PCT Filed: Apr. 6, 1984

[86] PCT No.: PCT/FR84/00093

§ 371 Date: Dec. 6, 1984

§ 102(e) Date: Dec. 6, 1984

[87] PCT Pub. No.: WO84/04223

PCT Pub. Date: Oct. 25, 1984.

[30] Foreign Application Priority Data

Apr. 15, 1983 [FR] France ................................ 83 06175

[51] Int. Cl.$^4$ ............................................. H05K 1/14
[52] U.S. Cl. ..................... 361/413; 361/394; 361/407; 361/415
[58] Field of Search ............... 361/407, 413, 415, 394

[56] References Cited

U.S. PATENT DOCUMENTS

| | | | |
|---|---|---|---|
| 3,372,308 | 3/1968 | Noschese et al. | 361/407 X |
| 3,495,134 | 2/1970 | Collins et al. | 361/407 X |
| 3,609,462 | 9/1971 | De Barros | 317/101 |
| 3,794,954 | 2/1974 | Reimer | 361/413 X |
| 4,151,580 | 4/1979 | Struger et al. | 361/415 |
| 4,179,172 | 12/1979 | Godsey et al. | 361/413 X |
| 4,215,386 | 7/1980 | Prager et al. | 361/394 |
| 4,253,087 | 2/1981 | Sall | 361/413 X |
| 4,327,546 | 12/1980 | Wells | 361/413 X |
| 4,472,764 | 9/1984 | Richard et al. | 361/407 |
| 4,490,775 | 12/1984 | Quan | 361/413 |
| 4,510,552 | 4/1985 | Kanno et al. | 361/413 |

FOREIGN PATENT DOCUMENTS

| | | |
|---|---|---|
| 0052462 | 5/1982 | European Pat. Off. . |
| 0067757 | 12/1982 | European Pat. Off. . |
| 2009720 | 2/1970 | France . |
| 1313641 | 4/1973 | United Kingdom . |

OTHER PUBLICATIONS

Allen et al., Card on Segmented Board Electronic Package, IBM Tech. Disc. Bull., vol. 19, #1, Jun. 1976, pp. 51 & 52.

Kehley et al., Side Entry Cable System, IBM Tech. Disc. Bull., vol. 20, #1, Jun. 1977, pp. 86 & 87.

Primary Examiner—R. R. Kucia
Attorney, Agent, or Firm—Young and Thompson

[57] ABSTRACT

An input card (7) is put in communication with apparatuses (16) the operation of which is to be monitored in order to initiate certain operations. A terminal-box (13) is interposed between the card (7), which possesses detector circuits (17), and the members (16).

The two ends of each circuit (17) are associated with a respective inner terminal (12) of the terminal-box (13), and the two ends of each member (16) are associated with a respective outer terminal (14) of the terminal-box (13). Shunts (19,21) mounted in the terminal-box and connected to supply terminals (14a, 14b) put one of the ends of each circuit (17) or member (16) at a common potential. The other terminal of each member (16) is connected to the other terminal of a circuit (17) by means of a connection (18).

The invention is used to avoid the need for auxiliary terminal-boxes and cards with a common potential point.

5 Claims, 18 Drawing Figures

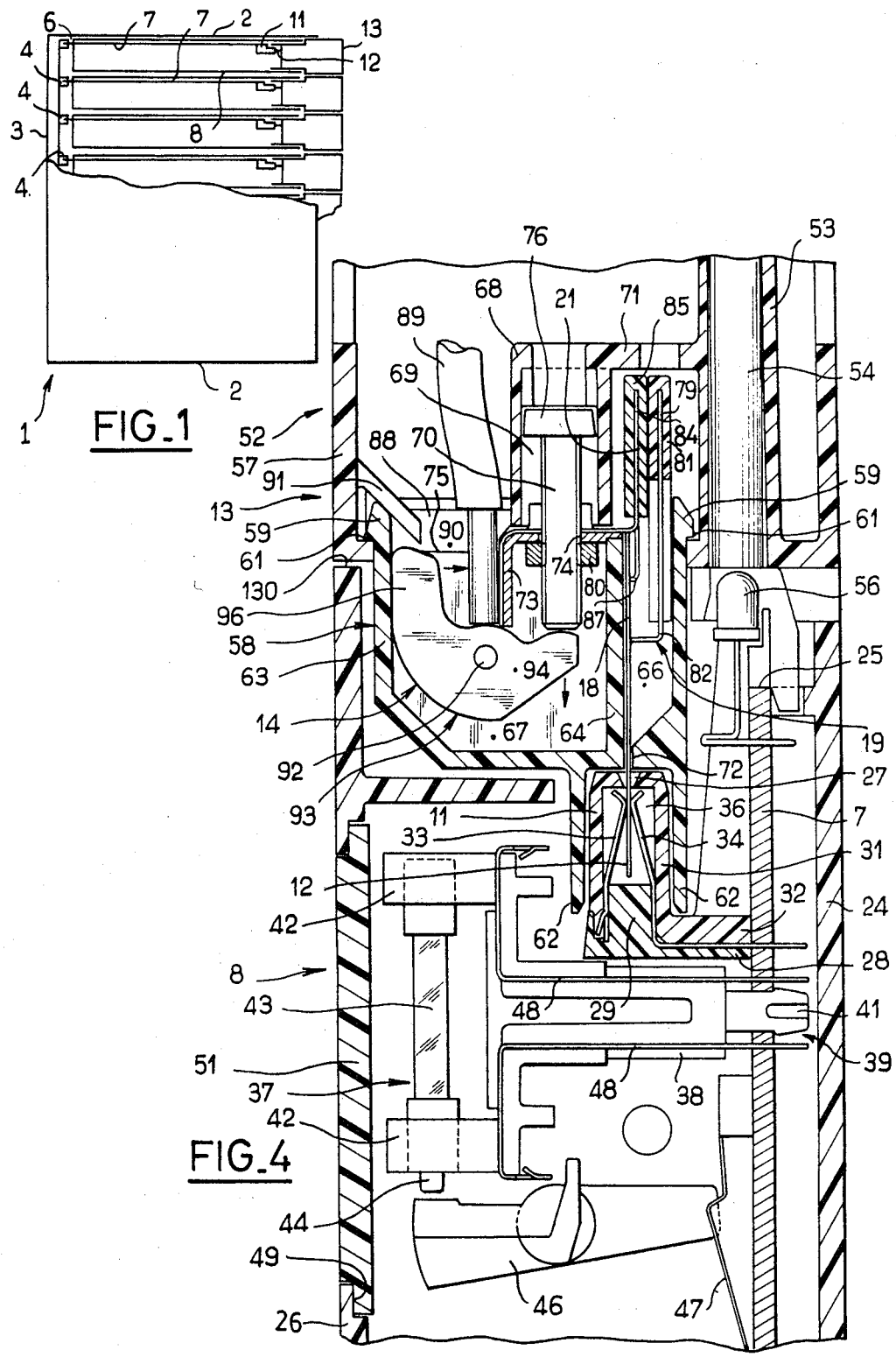

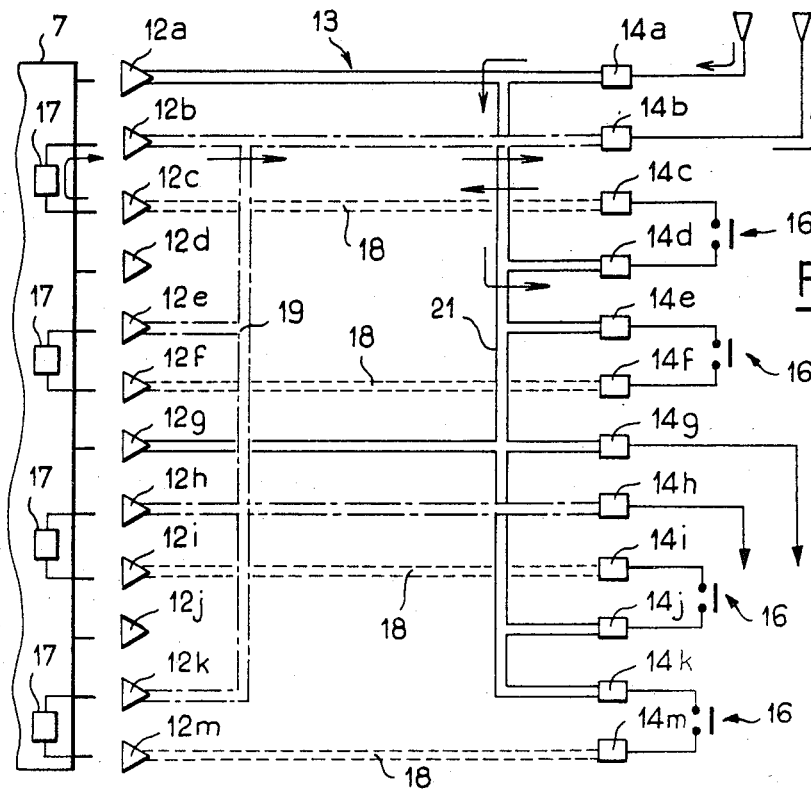
FIG_2
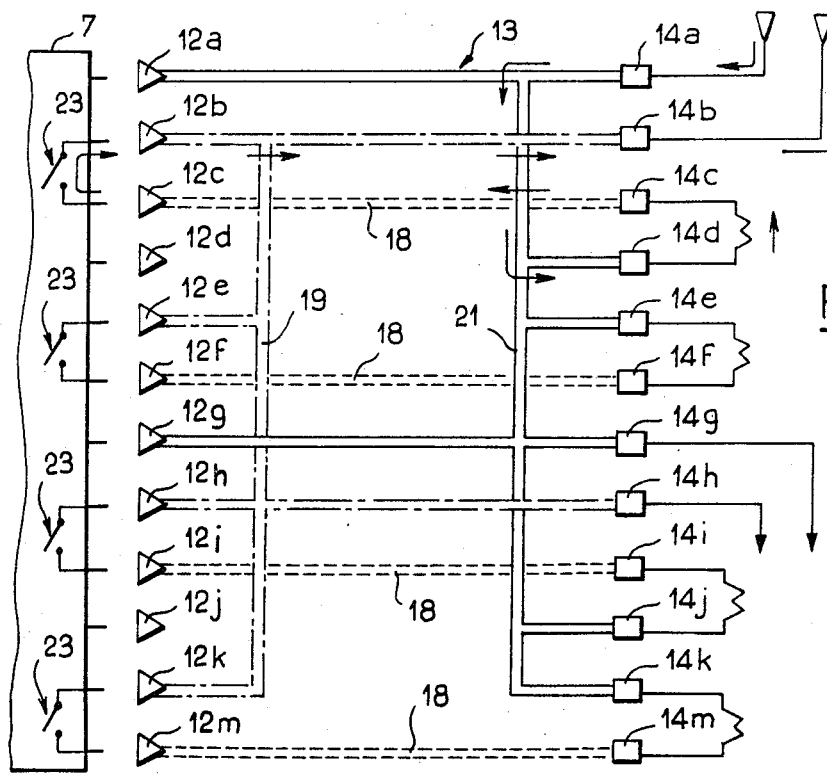
FIG_3

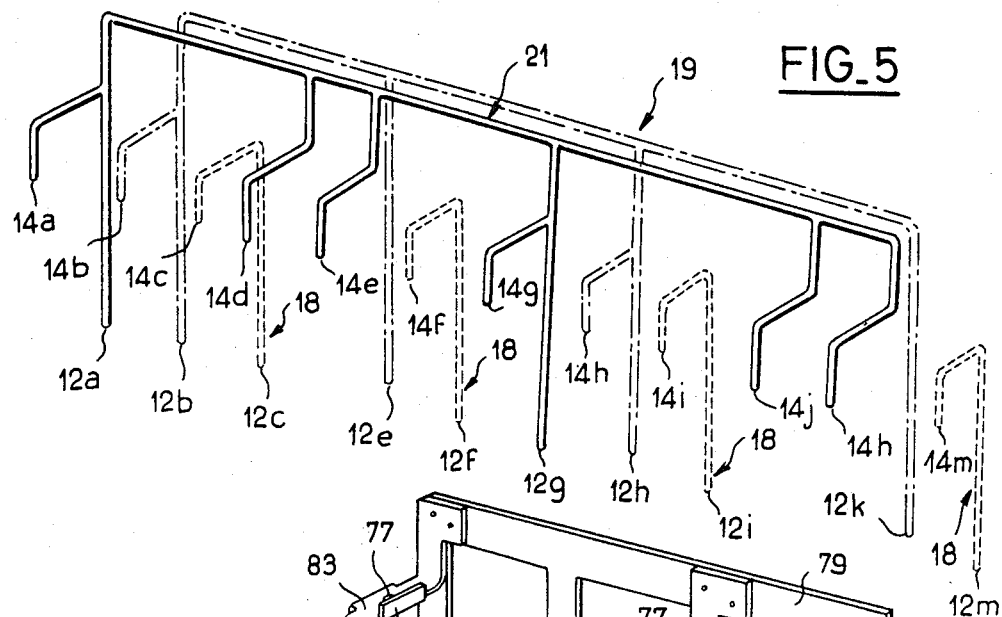
FIG. 5
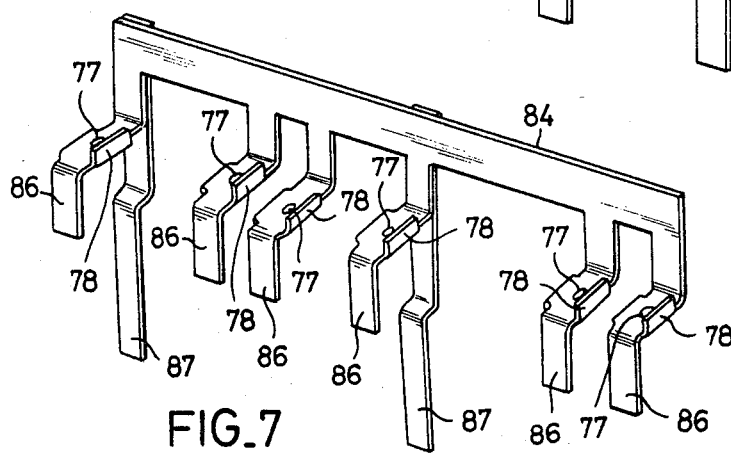
FIG. 6
FIG. 7
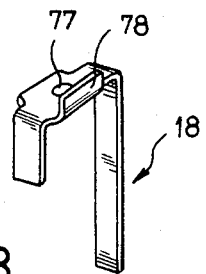
FIG. 8

FIG_9

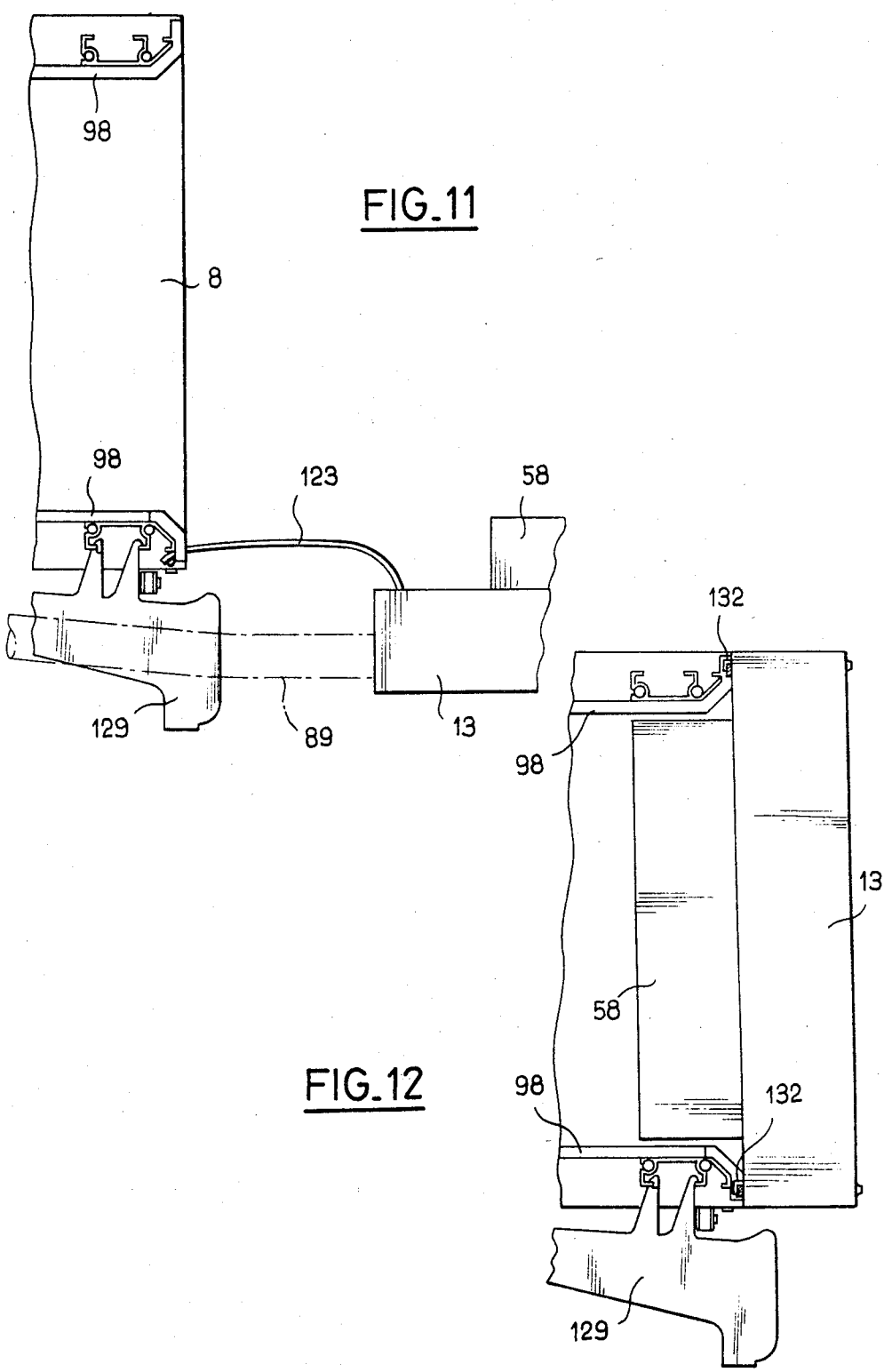

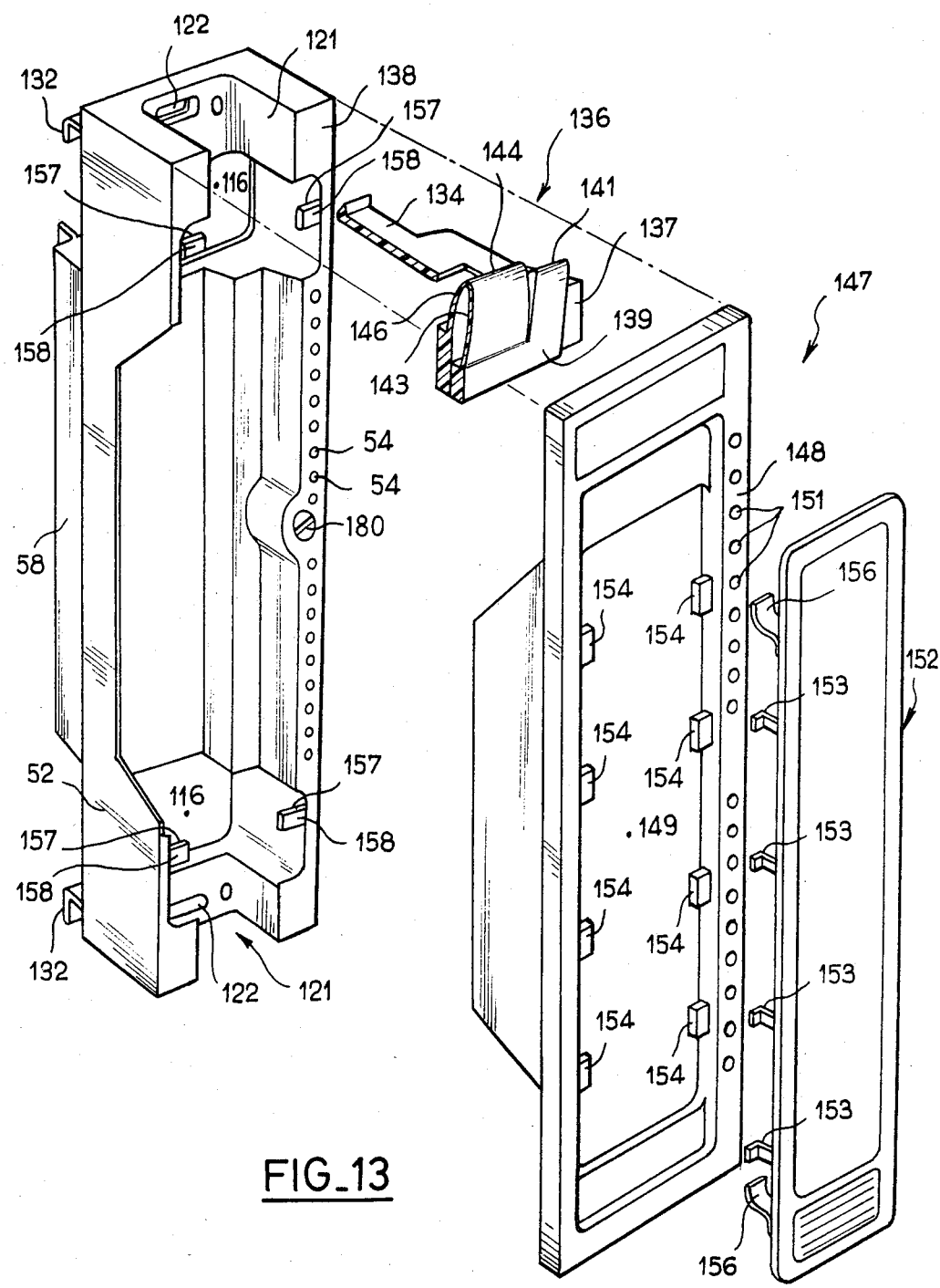
FIG_13

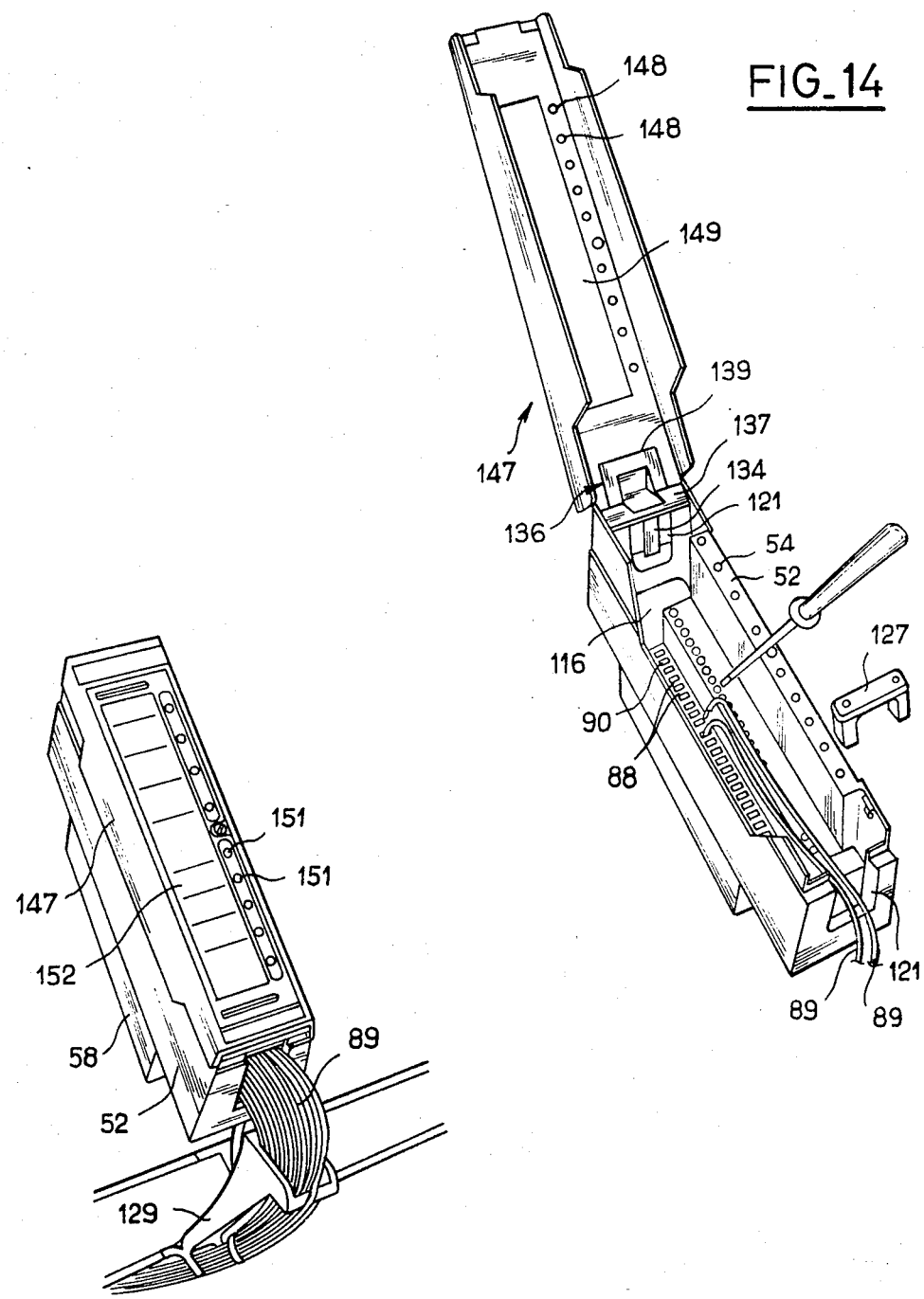

INPUT/OUTPUT DEVICE FOR AN APPARATUS OF THE PROGRAMMABLE AUTO-CONTROL TYPE, A RANGE OF SUCH DEVICES

BACKGROUND OF THE INVENTION

The present invention relates to an input/output device for an apparatus controlling industrial automatic equipment, such as a programmable auto-control or a range of such devices. The present invention also relates to a method of producing a terminal-box for such devices.

Programmable auto-controls covered by the invention comprise, in practice, a central unit and cards which have, on one edge, inner contacts for connecting them to a bus, such as a printed circuit itself connected to the central unit, and, on another edge, outer contacts intended for connection to the installation governed by the auto-control. The input/output cards contain electronic channels capable of transmitting and processing signals coming from sensors and intended for the bus, where input cards are concerned, and coming from the bus and intended for actuators, where output cards are concerned.

Each card, designated as an "input/output card" below, forms part of an input/output device also possessing a terminal-box, the purpose of which is to associate with each outer contact of the card a connecting terminal for the conductors extending to the sensors or the actuators respectively.

Input circuits, each comprising in series a voltage source, a sensor switch and an electronic detection channel carried by the input card, are wired to each input device. Output circuits, each comprising in series a switch carried by the card, the actuator to be controlled and a voltage source, are wired to each output device.

In some uses, it is desirable for the circuits formed in this way to be isolated from one another. In this case, the various channels must not have any common point on the card. In other uses, it is convenient to use a card on which there is a connection giving a reference potential common to all the channels.

However, the disadvantage of this is that each type of input/output card must be produced in three forms, depending on whether the channels are isolated, the common potential is positive or the common potential is negative. In spite of this, the flexibility of use is not as it should be, since, unless production is even more varied, there is no possibility of isolating some channels while at the same time ensuring that others carried by the same card have a common reference potential. Moreover, these connections provided on the card between each channel and a common potential point are troublesome because they take up precious space on the card and often make it necessary to take special precautions to have them intersect other conductive lines of the card.

However, other problems arise when the input/output circuits are to be interconnected. In fact, it is also necessary to provide between the sensors or actuators and the electrical source or sources one or more auxiliary terminal-boxes which are costly and bulky and which make the installation more complicated.

SUMMARY OF THE INVENTION

The general object of the invention is to simplify the input/output devices of programmable auto-controls or similar apparatuses for controlling industrial robots and to make them less costly and easier to assemble, wire up and use. The object of the invention is, in particular, to reduce the cost and bulk associated with the interconnections between the input/output circuits in programmable auto-controls or the like. The invention is thus aimed at an input/output device connectable by means of a bus to a central unit of an apparatus for controlling industrial automatic equipment, such as a programmable auto-control. The device comprises at least one card supporting a certain number of electronic channels processing and transmitting signals exchanged between the bus and equipment incorporating sensors, sending input signals, or actuators, to which output control signals are delivered. Each card being connected to the bus and to a terminal-box which comprises a series of inner terminals intended to be connected to the card and a series of outer terminals for connection to the equipment. In operation, each electronic channel is included in an input/output circuit in series with an inner terminal and an outer terminal, such that the terminals are connected electronically. The device also possesses means of interconnecting at least some of the input-output circuits.

According to the invention, the device is one in which at least some of the interconnection means are carried by the terminal-box.

Interconnections which were previously made on certain cards can now be made in the terminal-box. It is therefore possible to use only cards with isolated channels, and it is no longer necessary to have three different types for each set of given functions. The production cost and the value of the minimum stock held by the manufacturer (or by the user who has replacement parts at his disposal) can be reduced substantially, since, in contrast to cards, terminal-boxes are inexpensive.

The interconnections between the equipment (sensors or actuators) and the electrical source or sources can likewise be made in the terminal-box. It is therefore no longer necessary to provide, for this purpose, auxiliary terminal-boxes which have hitherto increased the costs and bulk.

According to another aspect, the invention is also aimed at a range of input/output devices connectable by means of a bus to a central unit of an apparatus for controlling industrial automatic equipment, such as a programmable auto-control. The range of device includes at least one device according to the first aspect of the invention. The devices of the range comprise at least one card supporting a certain number of electronic channels processing and transmitting signals exchanged between the bus, and equipment comprising sensors, sending input signals, or actuators, to which output control signals are delivered. Each card is connected to the bus and to a terminal-box possessing a series of inner terminals intended to be connected to the card and a series of outer terminals for connection to the sensors or actuators.

According to this second aspect of the invention, the range is one in which the terminal-boxes of all the devices of the range possess substantially identical isolating casings and differ in the shaping of the electrical connections mounted therein between the outer and inner terminals.

The user can thus select from the different devices of the range those which have the terminal-box containing the desired electrical connections between the various outer and inner terminals. The devices of the range can be varied, without greatly increasing the production costs, since it is not expensive to vary the electrical diagrams in substanitally identical terminal-box casings.

A third aspect of the invention is a method for producing the terminal-box of a device according to the first aspect of the invention or forming part of the range of the second aspect of the invention. According to the method there is produced an isolating casing in which is arranged a series of inner terminals, which can be matched with contacts carried by the card, and a series of outer terminals for connection to the equipment. The inner and outer terminals are connected to one another according to a specific electrical diagram, such that in order to connect the inner and outer terminals to one another in this way, a set of electrical connections is made. Some of the connections are shaped so as to connect to one another directly and independently of the other terminals, an inner terminal and an outer terminal intended to correspond to one another. Others are shaped so as to connect to one another two terminals of at least the same series. The desired electrical diagram for the terminal-box is produced by mounting in the casing electrical connections selected from the set mentioned above.

According to this method, the production of the various terminal-boxes is made even simpler.

Other particular features and advantages of the invention will also emerge from the following description.

BRIEF DESCRIPTION OF THE DRAWINGS

In the attached drawings given by way of non-limiting examples:

FIG. 1 is a diagrammatic view, partially in section, of a programmable auto-control;

FIG. 2 is an electrical diagram of a terminal-box input half according to the invention;

FIG. 3 is an electrical diagram of a terminal-box output half according to the invention;

FIG. 4 is a view of the terminal-box and of the housing in a partial section along a plane transverse to the edge of the card associated with the terminal-box;

FIG. 5 is a diagrammatic perspective view of the electrical connections in the terminal-box;

FIGS. 6 and 7 are perspective views of the shunts between the inner and outer terminals respectively;

FIG. 8 is a perspective view of a connection between an outer terminal and an inner terminal;

FIGS. 11 and 12 are views similar to the righthand part of FIG. 9, but one of them showing the terminal-box disengaged from the housing and the other the terminal-box hooked to the card guide in the absence of the housing;

FIG. 13 is an exploded perspective view showing the terminal-box, the hinge in section along its plane of symmetry and in the closing position, the cover and the label-holder;

FIGS. 14 and 15 are diagrammatic perspective views of the terminal-box during wiring and in operation respectively.

DESCRIPTION OF THE PREFERRED EMBODIMENTS

Figure 9:
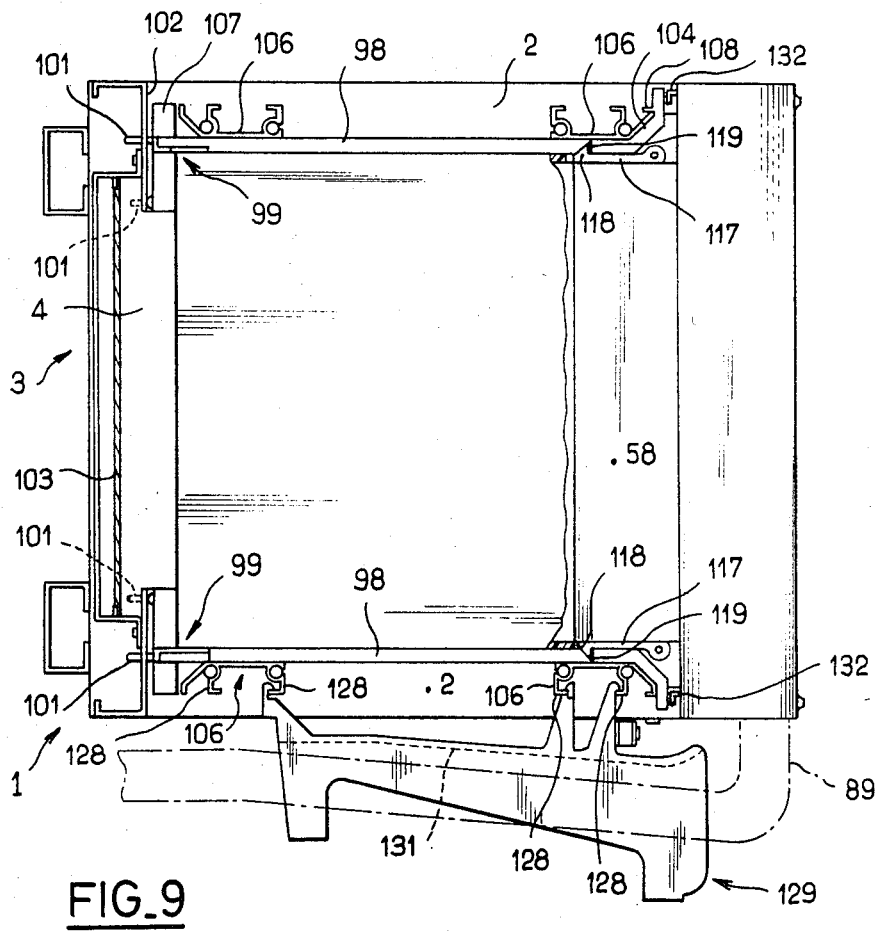
FIG. 9 is a diagrammatic view in side elevation of an input/output device, with a section through the auto-control container and the printed circuit.

As shown in FIG. 1, the programmable auto-control, taken as an example of an apparatus for controlling industrial automatic equipment, possesses a frame 1 which in turn comprises side walls 2 and a bottom 3, in which is accommodated a printed circuit carrying rows of connections 4 intended to be connected electrically to pins arranged along one of the edges of an electronic card, such as 7, mounted in a housing, such as 8. The cards can be input cards 7 connected to sensors, output cards 7 connected to actuators, central unit cards (not shown) or alternatively supply cards (also not shown). An information item coming from a sensor is processed by an input card and transmitted by the latter to the printed circuit which, performing the function of a bus, transmits it to the central unit. According to the information items coming from the sensors, the central unit prepares instructions which are directed towards the actuators via the bus and an output card. The input/output cards 7 accommodated in the housings 8 form part of the input/output devices to which the invention is more particularly directed. Each card 7 carries, in the vicinity of its edge 9 remote from the edge 6, a connector 11 having a row of contacts intended for interacting with the inner terminals 12 of a terminal-box 13.

In FIG. 2, the inner terminals of the terminal-box 13 are designated 12a to 12m. The terminal-box 13 also possesses outer terminals 14 designated 14a to 14m in FIG. 2. Where an input card is concerned, at least some of the outer terminals 14 connect the terminal-box 13 to contacts 16 belonging to sensors (not shown), the opening or closing of which indicates the state of an apparatus the operation of which is to be monitored.

Each contact 16 is associated with an electronic detection channel 17 provided on the card 7.

The terminal-box also contains electrical connections 18 which connect to one another an inner terminal (for example 12c) associated with one of the ends of a channel 17 and an outer terminal (for example 14c) intended to be connected to one of the terminals of a contact 16 thus associated with the channel 17 of the terminal 12c.

According to the invention, the detection channels 17 are isolated from one another. Furthermore, the two ends of each channel 17 are each associated with an outer contact of the card, this contact being intended to be connected to a respective inner terminal 12 of the terminal-box 13. In fact, each channel 17 is mounted between the first terminal 12c, 12f, 12i or 12m mentioned above and a second inner terminal 12b, 12e, 12h, 12k. The second inner terminals 12b, 12e, 12h, 12k are connected to one another by means of a shunt 19 arranged in the terminal-box 13.

The shunt 19 is made in the form of a branched connection likewise connected to an outer supply terminal 14b intended to be connected to one of the terminals of an electrical source.

Moreover, each contact 16 is mounted between the first outer terminal 14c, 14f, 14i, 14m already mentioned and a second outer terminal 14d, 14e, 14j, 14k. The second outer terminals are connected to one another by means of a shunt 21 arranged in the terminal-box 13. The shunt 21 is made in the form of a branched connection and is connected to another supply terminal 14a intended to be connected to the other terminal of the electrical source mentioned above.

By means of the structure and connections illustrated, each sensor 16 is connected to a detection channel 17 by means of an input circuit indicated by the arrows in FIG. 2 for one of the sensors 16. The channel 17 contains in series the outer supply terminal 14a, the shunt 21, a second outer terminal (for example 14d), the sensor 16 associated with the latter, the other outer terminal (14c) associated with this sensor, a 18, the first inner terminal (12c) located opposite the other outer terminal, the channel 17 connected to it, the second terminal (12b) associated with this channel, the shunt 19 and the other supply terminal 14b.

Moreover, the shunts 19, 21 are each connected to an outer transfer supply terminal 14h and 14g respectively. These terminals make it possible to transfer the voltage from the source present between the shunts 19, 21 towards another terminal-box, similar to terminal box 13.

It is likewise possible for the diagram of FIG. 2 to be only that of a terminal-box half arranged on the same material support as another identical or similar terminal-box half. This arrangement makes it possible to connect to one and the same card external components, such as the contacts 16, which operate at different voltages. If this is not the case, it is sufficient to connect by means of an external connection the terminals 14g, 14h of a first terminal-box half to the terminals 14a, 14b of a second terminal-box half, whilst the terminals 14g, 14h of the second terminal-box half can serve to transfer the supply towards another terminal-box, such as 13.

Moreover, if required, the shunt 21 is connected to an inner terminal 12a which makes it possible to have the supply voltage available on the card between the terminal 12a and one of the inner terminals connected to the shunt 19.

As shown in FIG. 3, a terminal-box 13 exactly like that of FIG. 2 can be used in an output device, the actuators 22 being mounted between the outer terminals, between which the contacts 16 are mounted in FIG. 2, whilst the output card 7 carries control channels consisting of switches 23 controlling the operation of the actuators. These switches, which can be electronic, are connected between the contacts corresponding to the inner terminals 12, between which detection channels 17 are mounted in FIG. 2. An output circuit (the arrows in FIG. 3) is defined in the same way as an input circuit, except that the contact 16 is replaced by an actuator 22 and the channel 17 by the channel 23.

Wiring is very simple, since the source and the equipment 16 or 22 are all connected to the terminal-box 13, and there are no connections to be provided in addition to the terminal-box 13. Auxiliary terminal-boxes are therefore eliminated. Moreover, in accordance with current recommendations, there is only one wire for each terminal.

The terminal-box 13 and the adjacent part of the housing 8 will now be described with reference to FIG. 4 which shows the inside of the housing. The input/output card 7 is mounted parallel to and at a short distance from one of the side walls 24 of the housing.

Facing the other side wall 26 of the housing, the card 7 carries the female connector 11 which has an L-shaped profile and which extends parallel to the general direction of the edge 25 of the card 7 facing the terminal-box 13.

The free end of the L-shaped profile is directed towards the terminal-box 13. The female connector 11 possesses in this free end a series of orifices 27 which are distributed over its length and which are each adapted to receive a male contact 12 forming one of the inner terminals of the terminal-box 13.

Thus, the associated orifice 27 and each inner terminal 12 are located in a respective plane which will be called the elementary plane hereafter and which is perpendicular to the general direction of the edge 25, that is to say parallel to the plane of FIG. 4.

The connector 11 has a base 28 which possesses, opposite the card 7, a rib 29 onto which is fitted a cap 31 through which the orifices 27 are provided. The cap 31 is extended towards the card 7 in a wing 32. In each elementary plane, two contact blades 33, 34 are pressed against one another, in such a way that it is possible to insert a male contact 12 there in a cavity 36 contained between the cap 31 and the rib 29. The two blades are mounted by being clamped between the rib 29 and the cap 31. Each blade 34 is extended between the wing 32 and the base 28 so as to be electrically connected to the card 7.

The housing 8 also contains, between the card 7 and the wall 26, a fuse block 37 having a body 38 which, adjacent the card, terminates in lugs 39 which have a hollow end enlarged and is provided with axial slots 41 so that it can be snapped into corresponding passages which the card 7 possesses under the connector 11.

The body 38 has the form of a T, the leg of which is perpendicular to card 7 and has the lug 39 as its end. In each elementary plane, the ends of the arms of the T carry a pair of holders 42 which are opposite one another and between which a removable fuse 43 is mounted. The striker 44 of the fuse 43 is opposite one of the ends of a rocker 46, the other end of which interacts with a fault-signalling contact blade 47 mounted on the card 7. Each holder 42 is in electrical contact with a bent conductor 48 extending along the body 38 up to the card 7, where it is connected in such a way that the fuse 43 is in series with the outer contact 33, 34 located in the same elementary plane. Opposite the fuse block 37, the housing 8 has an orifice 49 which is closed during operation by means of a removable cover 51. The fuses 43 can be replaced simply by opening the trap-door 51.

The terminal-box 13 has a body 52 which, substantially in the extension of the card 7; possesses a wall 53 in which is arranged in each elementary plane an optical duct 54, of which the end directed towards the housing 8 is adjacent to an electroluminescent diode 56 fastened and electrically connected to the card 7 so as to give visual information relating to the electrical conditions at the outer contact 33, 34 located in the same elementary plane. As shown, for example, in FIG. 14, the other end of the optical ducts 54 is in a plane outside the terminal-box body 52.

The body 52 also has a wall 57 (FIG. 4) which during operation is in the extension of the wall 26 of the housing 8. A gutter-shaped element 58, which will be called a "terminal-box bottom" and which forms with the body 52 an isolating casing for the terminal-box, has, at each of its free longitudinal edges, noses 59 directed outwards and intended to be snapped behind shoulders 61 provided at their end directed towards the housing 8 by the faces, directed towards one another, of the walls 53 and 57. The open side of the bottom 58 is directed towards the terminal-box body 52. On its other side, the bottom 58 has two ribs 62 intended for receiving the cap 31 of the female connector 11, so that it fits between them, whilst one 63 of the side walls of the bottom 58 is adjacent to the inner face of the wall 26 of the housing 8.

The interior of the bottom 58 is subdivided by a longitudinal partition 64 into a compartment 66 for electrical connections 18, 19, 21, on the one hand, and, on the other hand, a series of compartments 67, one for each elementary plane, which are separated by partition walls 88 parallel to the elementary planes. Each compartment 67 is adjacent to the wall 63 and contains one of the outer terminals 14 of the terminal-box 13. An orifice 90, opening towards the body 52 between each pair of adjacent partition walls 88, serves for the introduction of a wire 89 connecting the terminal 14 to the equipment to be monitored or controlled 16, 22 or to an electrical source.

The terminal-box body 52 possesses a thick wall 68 which is parallel to the wall 57 and in which is made, in each elementary plane, a chamber 69 opening on the one hand opposite the housing 8 and on the other hand opposite the compartment 67 containing outer terminals. A connecting wall 71 between the end of the thick wall 68 and the wall 53 delimits a space opening towards housing 8, and communicates with the compartment 66 so as to compliment completes the latter.

As also shown in FIGS. 5 to 8, the electrical connections 18 are metal blades bent in the form of a walking-stick, the leg of which extends flat against the partition 64 in the compartment 66 and projects from the latter via an orifice 72 provided in each elementary plane opposite the corresponding orifice 27 of the cap 31. The inner face of the bent portion of the walking-stick extends against the central part 70 of a conductive yoke, the wings 75 of which are parallel to the elementary planes and are each positioned against one of the two partition walls 88 of the compartment 67 in question. The central portion 70 is positioned at the end of the partition 64, so as to extend under the wall 68. Away from the partition 64, the portion 70 is bent into a tongue 73 directed towards the housing 8 substantially in the extension of the wall 68. The portion 70 has a perforation 74, which accommodates a connecting screw 76, the head of which is in the chamber 69 and which interacts with a nut 80 held captive in a way known per se between the two wings 75 of the yoke. The connections 18 and also the shunts 19 and 21 have corresponding perforations 77 (FIGS. 6, 7 and 8) and, next to these, tabs 78 intended for penetrating into the corresponding chamber 69, so as to position the electrical connections 18, and shunts 19 and 21 relative to the terminal-box 13.

The shunt 19 (FIG. 6) comprises a strip cut out so as to provide a core 79 extending longitudinally in the space located between the walls 53, 71, 68, where it is covered with an insulating sheath 81 (FIG. 4), and wings 82, each of which is pressed against the partition 64 and extends down to the compartment 36, passing via the compartment 66, a slit 72 and a slit 27. Riveted to the core 79 are two counter-bent tongues 83 (FIG. 6) profiled so that their inner face extends against the portion 70 and the tongue 73, so as to provide the electrical connection with the outer terminals 14b and 14h (FIGS. 2 and 3). The tongues 83 have the perforations 77 and tabs 78 mentioned above.

The shunt 21 (FIG. 7) comprises a strip cut out so as to provide a core 84 similar to the core 79 and accommodated during operation in a sheath 85 between the latter and the wall 68, and wings 86 shaped in a similar way to the tongues 83 of the shunt 19. During operation, the inner face of each wing 86 extends against the portion 70 and a tongue 73, and a screw 76 extends through it. Riveted to the core 84 are two tongues 87 which are pressed against the partition 64 and which extend into the compartment 36, passing via the compartment 66, an orifice 72 and an orifice 27.

FIG. 5 shows how the three types of connections and shunts (18,19,21) are arranged practically relative to one another according to the electrical diagram of FIGS. 2 and 3.

The wall 57 has (FIG. 4), in each elementary plane, a lip 91 directed obliquely into the orifice 90 as a guide slope for the engagement of the wire 89, on the one hand, and as a stop for the snap-in nose 59, on the other hand.

Each compartment 67 contains a rocker 93, to which are fastened two opposing journals 92, each mounted rotatably in one of the yoke wings 75 which, for this purpose, extend beyond the tongue 73 towards the wall 63. One arm 94 of the rocker 93 is in the path of the end of the screw 76, whilst the other arm 96 extends approximately parallel to the screw 76 in the direction away from the housing 8, so that, when the screw 76 is screwed in towards the housing 8, the stripped end of the wire 89 can be gripped between the arm 96, on the one hand, and the end portion, pressed against the tongue 73, of a connection 18, a tongue 83 or a wing 86, on the other hand.

To mount the terminal-box, the conductive yoke 70, 75, 73, the connections 18 and the shunts 19 and 21 are positioned relative to the terminal-box bottom 58 and are maintained there, whilst at the same time screwing of the screws 76 is started. The bottom 58 is subsequently snapped in engagement with the body 52, and the connections to the outer terminals 14 are made when the wires 89 are put in place and the screws 76 are tightened. The movement of the yoke 70, 75, 73 and of the various electrical connections and shunts 18, 19, 21 in the direction away from the housing 8 is prevented when they come up against the thick wall 68. It is then sufficient to fit the terminal-box 13 into the housing 8 while inserting the free ends of the connections 18, of the wings 82 and of the tongues 87 into the female connector 11 in a direction parallel to that of the abovementioned fitting.

Figure 10:
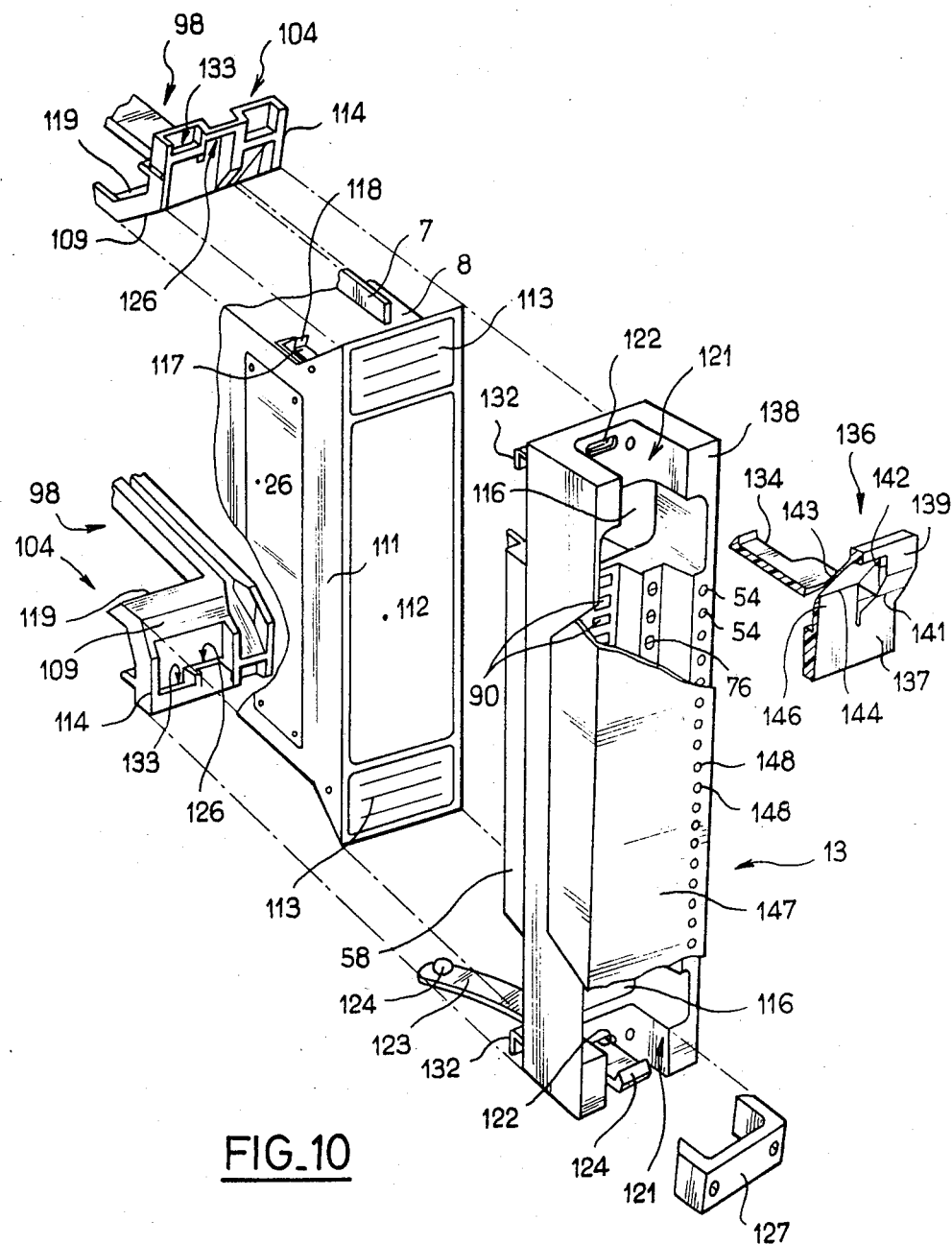
FIG. 10 is an exploded perspective view showing the card guides and the housing in a partial view, the terminal-box with its cover cut away, and various connecting pieces including a hard-point hinge which is in section along its plane of symmetry.

As shown in FIG. 10, the card 7 projects laterally from the two sides of the housing 8 carrying said card, whereby the card can slide in slots 97 of two opposing slides or card guides 98. As shown in FIG. 9, the card guides 98 comprise a foot 99 having lugs 101, by means of which it is positioned laterally relative, on the one hand, to a plate 102 forming part of the bottom 3 and, on the other hand, to the rows of connections 4 which are fastened to the printed circuit 103 and which project towards the interior of the container 1 via elongate apertures made in the plate 102.

The card guides 98 possess, remote from the bottom 3 of the container 1, a widened head 104 having substantially the same width as the housings 8 and as the feet 99. The side walls 2 of the container 1, which are parallel to the cards 7, are connected to one another by means of two pairs of profiled crossmembers 106. Each pair is mounted on the outside of an apertured wall formed by the slides 98 aligned side by side. On each side, one of the crossmembers 106 is pressed against a rear wing 107 of the foot 99 of the slides 98. The other crossmember 106 is mounted against the heads 104 and inserted behind a lip 108 which projects from each head 104 towards the bottom 3 of the container 1, so as to prevent the slides 98 from tilting in both directions.

As shown in FIG. 10, the heads 104 have a chamfer 109 widening the entrance between the slides 98, and the housings have a trapezoidal head 111, the shape of which corresponds to this entrance. The face of the housing 8 facing towards the terminal-box 13 has an orifice 112 (represented diagrammatically) for the bottom 58 of the terminal-box 13 and, at the ends of this face, two surfaces supporting graphical information 113.

The terminal-box 13 is longer than the housing 8, so as to cover also two rims 114 provided on the slides 98 beyond the chamfers 109 and facing towards the outside of the container 1. On either side of the bottom 58, which does not extend over the entire length of the terminal-box 13, two windows 116 are provided through the body 52 of the terminal-box so as to match with the marking surfaces 113 when the terminal-box is fitted into the orifice 112 of the housing 8.

In its trapezoidal head 111, the housing carries two pivotable latches 117, each mounted in an aperture made in one of the narrow lateral faces of the housing. As shown diagrammatically in FIG. 9, the bottom 58 of the terminal-box 13, when fitted into the housing 8, forces the latches 117 outwards against the head 104 of the slides 98 into a position in which an end nose 118 of the latches 117 is engaged behind a shoulder 119 provided on the head 104 so as to face towards the bottom 3 of the container 1.

Thus, the housing 8 cannot be slid from the operating position towards the outside of the container 1 as long as the terminal-box 13 has not been extracted from the housing 8.

Each window 116 (FIG. 10) is separated from the adjacent end of the terminal-box 13 by a trough 121 opening away from the housing 8. A slot 122 passes through the bottom of each trough 121. Slidably mounted in that slot 122 which is the lower one of each terminal-box during operation (FIG. 10) is a lamella 123, the two ends of which are provided with thickened stop portions 124. A portion of the lamella 123 which is nearer to the printed circuit is, during operation, slidingly mounted in slot 126 provided through the rim 114 of the end 104. As shown in FIG. 11, the length of the lamella 123 is sufficient to allow the terminal-box 13 to be completely and axially extracted in the housing 8. The upper card guide 98 (FIG. 10) also has a slot 126 allowing a lamella 123 to be fitted, since where double-height containers are concerned it is useful to be able to open towards the top housings which have only half the height of the container and which are located above another similar half-housing.

As shown in FIG. 14 during wiring and FIG. 15 once wiring is finished, the wires emerging from the orifices 90 between the partition walls 88 are all directed towards the trough 121, in which the lamella 123 is already mounted, and during operation prevent the latter from sliding outwards.

A bridge member 127 (FIG. 10) is screwed in the trough 121 occupied by the wires and retains them in it.

Only the upper marking surface 113 can be used, the other being concealed by the wires 89 when the terminal-box is in place. However, the situation is reversed in the abovementioned case of certain housings in double-height containers.

As shown in FIG. 9, the crossmembers 106 have wings ending towards the outside of the container 1 in hooks 128, onto which a series of wire guides 129 (one for each housing 8) can be snapped. Only the lower face of the container 1 carries such wire guides, except where the double-height containers mentioned above are concerned. The wire guides have a bottom wall 131 which is substantially apart from the container 1, so that, during wiring, a certain length of the wires is necessarily provided between the wire guide 129 and the trough 121. It is thus possible to disengage the terminal-box 13 from the housing 8, without unduly pulling the wires 89 and without having to include the terminal-box 13 before full extraction from the housing 8.

The troughs 121 also each carry a downward-directed hook 132 on their face directed towards the housing 8 during operation. The terminal-box 13, when engaged as far as possible in the housing 8, abuts against the edge 130 (FIG. 4) of the wall 26 of the housing 8. The hooks 132 are opposite, but spaced apart from the rim 114 of each slide 98 (FIG. 9).

As shown in FIGS. 10 and 12, in the absence of the housing 8, the hooks 132 make it possible to preposition the terminal-box 13 to carry out the wiring. For this purpose, it is sufficient to engage each hook 132 in an upwardly opening recess 133 provided in the rim 104 of each slide 98.

The slot 122 (FIGS. 10 and 13) which does not accommodate the lamella 123, that is to say the upper slot 122 in the example illustrated, receives a snap-in hook 134 belonging to a plastic hinge 136 which moreover possesses a wing 137 perpendicular to the hook 134 and extending against the outer face 138 of the housing body 52 when the hook 134 is engaged in the slot 122. The hinge also has a movable wing 139 articulated on the wing 137 and on the hook 134 by means of a thinner portion 141. The wings 137 and 139 have a rectangular orifice 142 (FIG. 10), of which the two edges parallel to the plane of the wing 134 are connected by means of a thin wing 143 articulated via a thinner portion 144 to a wing 146 of intermediate thickness having a certain degree of flexibility. The thinner portions 144 and 141 are parallel, but are not aligned, so that the rotary movements of the wing 139 about the thinner portion 141 cannot take place without bending in the semi-thick wing 146. There is a stable opening position shown in FIG. 10, in which the wing 139 is directed outwards opposite the wing 137. When the wing 139 is pivoted away from the hook 134, a hard point of resistive position is passed before the closing position shown in FIG. 13 is reached, the wing 139 is folded against the wing 137.

The wing 139 of the hinge 136 is fastened to the back of a cover 147 which is shown diagrammatically in FIG. 10 and which will be described in detail with reference to FIG. 13. It comprises a frame 148 surrounding a window 149 and having in one of its longitudinal pillars a series of orifices 151, each of which matches one of the optical ducts 54 of the terminal-box body 52.

The cover 147 also incorporates a label holder 152 which carries on its inner face, along its longitudinal sides, lugs 153 which are directed towards the terminal-box body 52 and the end of which is bent outwards. During operation, the lugs 153 are engaged behind bosses 154 which are carried by the longitudinal pillars of the frame 148 and which project into the window 149, so that the label holder 152 can slide relative to the frame 148 in the direction of their length. The label holder 152 also carries on its inner face four hooks 156 which, during operation, are all directed upwards and which project into the window 149 of the frame 148, so as to interact with stop shoulders 157 consisting of the inner face of pegs 158 which project towards one another in pairs in the windows 116 of the terminal-box body 52. Thus, when the label holder 152 is displaced upwards relative to the frame 148 and the cover 147 is closed, the hooks 156 engage the back face of the pegs 157 and prevent the cover from opening. To open the cover 147, the label holder 152 is displaced downwards, thus releasing the hooks 156 from the pegs 157, and the cover 147 is pivoted upwards, into a position where it is retained by the hard-point hinge.

It can also be seen in FIG. 13 that the ducts 54 are distributed in two groups of equal numbers, between which a fast-pitch screw 180 is rotatably and unslidably mounted, without and is adapted to be screwed into the housing 8 to ensure that the terminal-box is fastened to the housing and, if required, to assist in extracting the terminal-box 13 from the housing 8 by simply rotating the screw 180 in the unscrewing direction.

According to an important aspect of the invention, the input/output device just described can form part of a range of input/output devices which can conform to what has just been described with reference to FIGS. 2 to 15, with the exception of the electrical connections an shunts 18, 19, 21 between the inner terminals 12 and the outer terminals 14.

Figure 16:
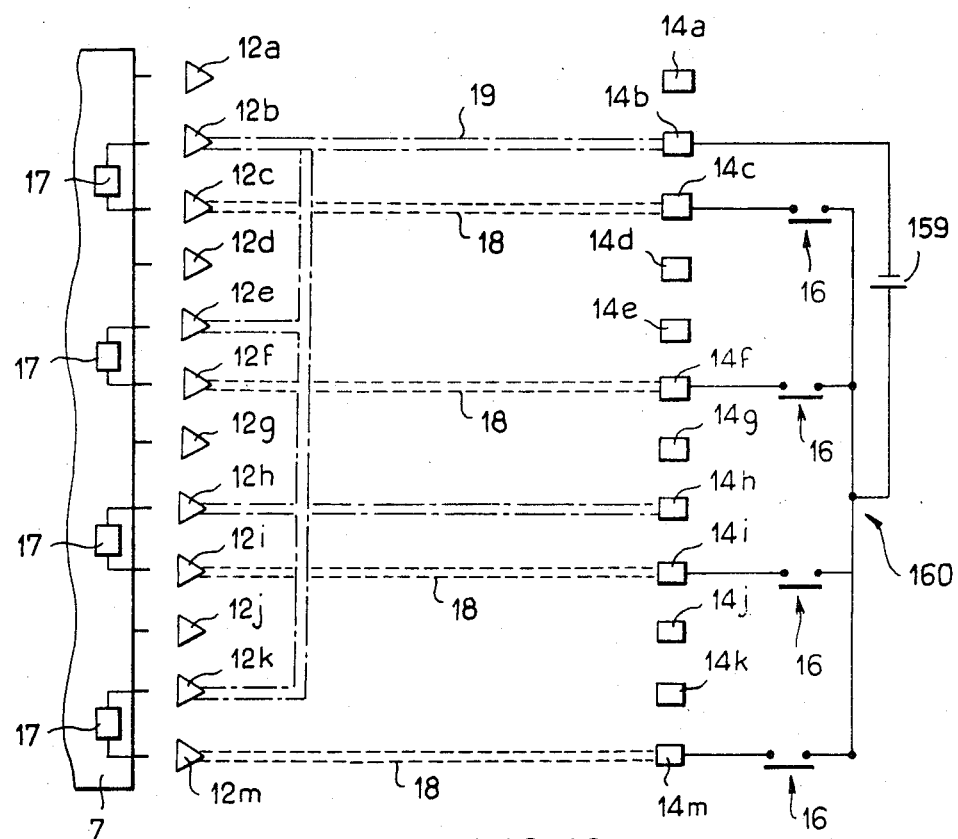
FIG. 16 is a view similar to FIG. 2, but relating to the terminal-box of another device of the range.

In another input/output device illustrated in FIG. 16 and forming part of the same range, the electrical connections are the same as in the example of FIGS. 2 to 15, except that the shunt 21 has been omitted.

In this case, the convenient method of connection to the card 7 is still beneficial, without the card needing to have a common potential point.

However, next the outer terminals 14, there must be an auxiliary terminal-box 160 between the source 159 and the various components 16 to be monitored.

The same diagram could have been provided for an output card if the contacts 16 had been replaced by the actuators 22 and the channels 17 by electronic switches 23.

Figure 17:
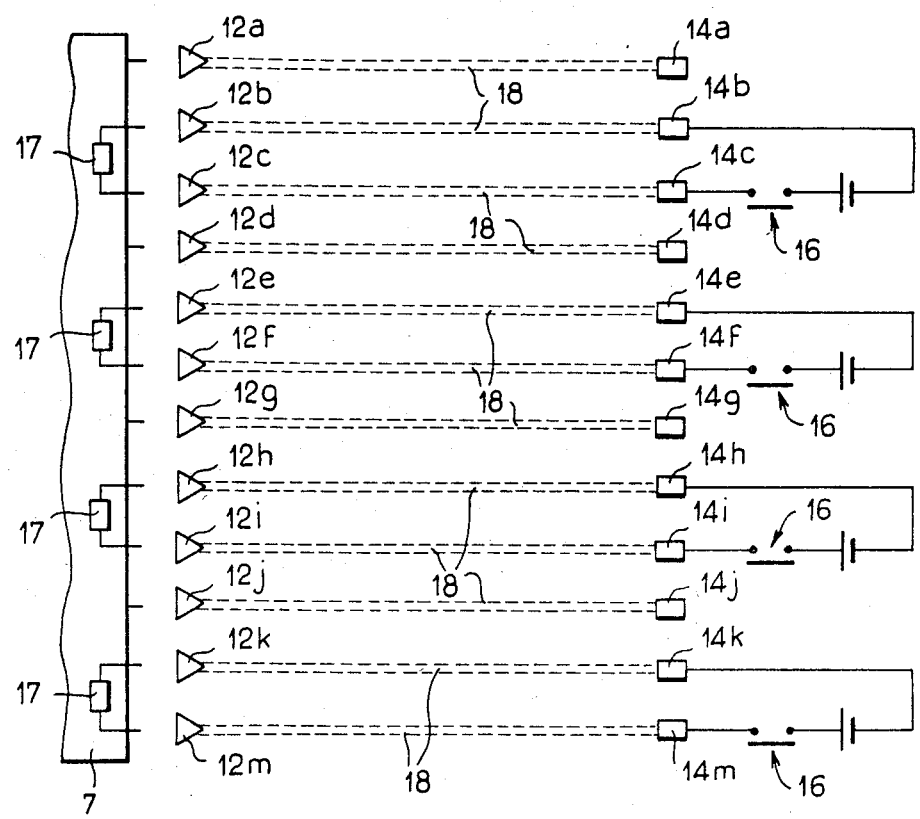
FIGS. 17 and 18 are views similar to FIGS. 2 and 5, but relating to the terminal-box of a third device of the range.
Figure 18:
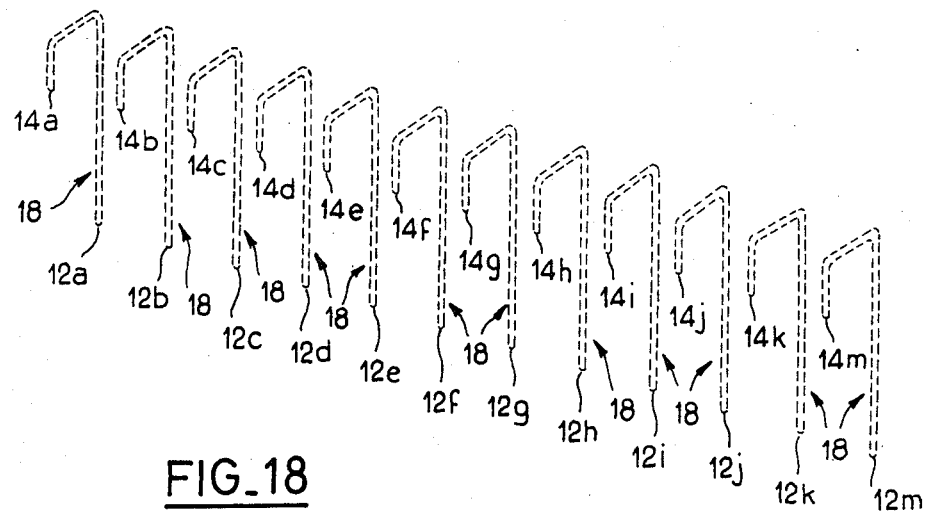

In another device of the same range, illustrated in FIGS. 17 and 18, the shunts 19 and 21 are omitted completely and a connection 18 is provided in each elementary plane between the inner terminal 12 and the outer terminal 14. This results in a so-called "transparent" terminal-box which no longer affords the wiring facilities of the embodiments of FIGS. 2 to 16, but which may be preferred because of the great degree of freedom which it allows as regards the wiring diagram and as regards the arrangement of the electronic circuits on the card 7.

In the method according to the invention for producing the various terminal-boxes of the range 13, it is expedient to keep in stock bodies 52 which are all identical and which are equipped with light ducts 54 and, if appropriate, a cover 147 with a label holder 152, terminal-box bottoms 58 likewise all identical and equipped with a set of rockers 93, yokes 70, 75, 73 all identical and provided with a connecting screw 78 and a nut 80, connections 18 all identical, shunts 19 all identical and shunts 21 all identical. The particular nature of the terminal-box will result solely from the selection made from the electrical connections and shunts 18, 19 and 21 during assembly and from the arrangement of these connections in the terminal-box 13.

Because of the range of devices and the method of producing them, the manufacturer can propose to the user a choice of terminal-boxes meeting all the situations currently encountered, whilst at the same time incurring, for the actual terminal-boxes, costs which are scarcely higher than those which would result from a single type. The saving is further reinforced because all the cards 7 can be identical for a set of given functions, and whether isolated channels, a positive common potential or a negative common potential are used no longer necessarily has any affect on the card. Of course, the user benefits from these savings, and because of the invention he is also able to avoid the use of auxiliary terminal-boxes as soon as possible.

It has been possible to produce side by side in the terminal-box a row of luminous indicators 54, a row of screws 76 and a row of orifices 90 for introducing the wires 89, so that in each elementary plane there is the corresponding wire 89, the corresponding screw 76 and a corresponding indicator 54. Furthermore, the screw 76 and the direction of introduction of the wire 89 are perpendicular to the printed circuit 103 and parallel to the card 7, thus making the wiring work much easier.

In general terms, the embodiment described is notable in that it is highly functional and easy to use.

Of course, the invention is not limited to the examples described and illustrated, and many modifications can be made to these examples, without departing from the scope of the invention.

Another device of the range mentioned above could incorporate the shunt 21, but not the shunt 19. This model would make it possible to dispense with the auxiliary terminal-box 160, but on the other hand a special card with a common point will have to be used if such a common point is desired.

It would also be possible to provide several ranges which differ, for example, in the length of the housings and the terminal-boxes, some being intended for double-height or triple-height containers.

Moreover, the invention is in no way incompatible with cards possessing channels with three terminals, and, as in the case of channels with two terminals, one of these can be connected by means of a shunt, such as 19, contained in the housing to an inner terminal associated with another channel of the card.

We claim:

1. An apparatus for controlling an automatic installation, said apparatus comprising a plurality of cards (7) each supporting a plurality of electronic channels (17, 23) for processing and transmitting signals exchanged between a bus (103) and equipment incorporating both sensors (16) detecting an operating condition of said installation and actuators (22) to which output control signals are delivered, each card (7) being connected to a control unit through the bus (103) and to a terminal box (13), each card being contained in a housing (8) which is slidably inserted in a container (1), wherein each terminal box (13) comprises a portion (58) which is removably inserted in a front aperture (112) of said housing (8), and which when inserted therein engages at least one latch (117) displaceably carried by the housing (8), and wherein upon insertion said latch is in a position wherein said latch further engages a retriever portion (119) of the container (1) so as to lock the housing (8) in a position of insertion in the container (1).

2. An apparatus for controlling an automatic installation, said apparatus comprising: a plurality of cards (7) each supporting a plurality of electronic channels (17, 23) for processing and transmitting signals exchanged between a bus (103) and equipment incorporating both sensors (16) detecting an operating condition of said installation and actuators (22) to which output control signals are delivered, each card (7) being connected to a control unit through the bus (103) and to a terminal box adapted to interconnect the card with said equipment, each card being contained in a housing (8) which is received in a container (1), wherein each terminal box (13) is provided with means (132) adapted to engage, when a respective housing (8) is absent from a container (1) complementary supporting means (133) of the container (1), and to thereby support the terminal box (13) at substantially the same location with respect to the container as the location assumed by said terminal box (13) when secured to the housing (8) while the housing (8) is inserted in the container (1).

3. An apparatus for controlling an automatic installation, said apparatus comprising a plurality of cards (7) each supporting a plurality of electronic channels (17, 23) for processing and transmitting signals exchanged between the bus (113) and equipment incorporating both sensors (16) detecting an operating condition of said installation and actuators (22) to which output control signals are delivered, each card (7) being connected to a control unit through a bus (103) and to a terminal box (13) wherein each terminal box (13) has a portion (58) which is removably and slidably inserted in a front aperture (112) of a respective housing (8) containing a respective one of said cards (7) and is connected to the equipment by means of a bundle of wires (89) entering the terminal box at one end and having a sufficient loose length to allow extraction of said portion (58) from the housing (8) and pivotal movement of the terminal box (13) about said one end thereof and wherein a means (123) is connected to each terminal box (13) adjacent the bundle of wires (89) for limiting travel of said end of each terminal box (13) out of the housing (8).

4. An apparatus according to claim 3 wherein the means for limiting travel (123) comprises a flexible lamella (123) slidably received in a container (1) for limiting travel.

5. An input/out device connectible by means of a bus (103) to a control unit of an apparatus for controlling an automatic installation said device comprising a plurality of cards (7) each supporting a plurality of electronic channels (17, 23) for processing and transmitting signals exchanged between a bus (103) and equipment incorporating both sensors (16) detecting an operating condition of said installation and actuators (22) to which output control signals are delivered, each card (7) being connected to a control unit through the bus (103) and to a terminal box (13), wherein each terminal box (13) is mounted against a front wall having an aperture (112) of a respective housing (8), said front wall having an information surface (113) at two opposite ends of said aperture (112), said terminal box having two windows (116) which match said information surfaces (113) when the terminal box (13) is positioned in the housing (8) and wherein terminals of the terminal box (13) are connected to the equipment by a bundle of wires (89) over one of the windows (116).

* * * * *